(12) United States Patent
Wang et al.

(10) Patent No.: US 12,727,346 B2
(45) Date of Patent: Sep. 1, 2026

(54) DISPLAY SUBSTRATE, MANUFACTURING METHOD THEREOF, AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Ming Wang, Beijing (CN); Dacheng Zhang, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 315 days.

(21) Appl. No.: 18/283,970

(22) PCT Filed: Jul. 6, 2022

(86) PCT No.: PCT/CN2022/104155
§ 371 (c)(1),
(2) Date: Sep. 25, 2023

(87) PCT Pub. No.: WO2024/007197
PCT Pub. Date: Jan. 11, 2024

(65) Prior Publication Data

US 2025/0089487 A1 Mar. 13, 2025

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/1213* (2023.02); *H10K 59/124* (2023.02)

(58) Field of Classification Search
CPC .. H10K 59/12; H10K 59/1201; H10K 59/121; H10K 59/1213; H10K 59/124;
(Continued)

(56) References Cited

U.S. PATENT DOCUMENTS

| | | | |
|---|---|---|---|
| 8,674,359 | B2 | 3/2014 | Noh et al. |
| 10,026,797 | B2 | 7/2018 | Nam et al. |

(Continued)

FOREIGN PATENT DOCUMENTS

| | | | |
|---|---|---|---|
| CN | 102280488 | A | 12/2011 |
| CN | 102709239 | A | 10/2012 |

(Continued)

OTHER PUBLICATIONS

May 19. 2025—(US) Non-Final Office Action—U.S. Appl. No. 17/770,045.

(Continued)

*Primary Examiner* — Brook Kebede
(74) *Attorney, Agent, or Firm* — Banner & Witcoff, Ltd.

(57) ABSTRACT

A display substrate, manufacturing method thereof, and display device. In the display substrate, a gate insulating pattern is located at a side of an active layer, a metal conductive layer is at least partially located at a side of the gate insulating pattern. The gate insulating pattern includes a first opening, the active layer includes a second opening, an orthographic projection of the second opening on the base substrate is located within an orthographic projection of the first opening on the base substrate, the metal conductive layer includes a main body part and an extension part, the extension part is electrically connected with the active layer exposed by the first opening, and the conductive structure is overlapped with the extension part, and includes a connec- (Continued)

tion part extending to the second opening and electrically connecting the active layer on two sides of the second opening.

20 Claims, 9 Drawing Sheets

(51) Int. Cl.
*H10K 59/121* (2023.01)
*H10K 59/124* (2023.01)

(58) Field of Classification Search
CPC ...... H10K 59/131; H10K 71/60; H10D 30/67; H10D 30/6729; H10D 86/00; H10D 86/40; H10D 86/441; H10D 86/443; G09F 9/00; G06G 1/00
See application file for complete search history.

(56) References Cited

U.S. PATENT DOCUMENTS

| | | | |
|---|---|---|---|
| 10,790,344 | B2 | 9/2020 | Kim |
| 10,797,124 | B2 | 10/2020 | Song et al. |
| 11,018,236 | B2 | 5/2021 | Su et al. |
| 2004/0135520 | A1 | 7/2004 | Park et al. |
| 2006/0008932 | A1 | 1/2006 | Oh et al. |
| 2006/0145162 | A1 | 7/2006 | Yang |
| 2009/0242894 | A1 | 10/2009 | Chen |
| 2009/0243482 | A1 | 10/2009 | Tohyama et al. |
| 2009/0278131 | A1 | 11/2009 | Kwon et al. |
| 2010/0140612 | A1 | 6/2010 | Omura et al. |
| 2011/0248345 | A1 | 10/2011 | Sasagawa |
| 2014/0061635 | A1 | 3/2014 | Liu |
| 2014/0077213 | A1 | 3/2014 | Zhang et al. |
| 2014/0168556 | A1 | 6/2014 | Liu |
| 2014/0291636 | A1 | 10/2014 | Kim et al. |
| 2015/0185570 | A1* | 7/2015 | Zhang ............... G02F 1/136227 257/72 |
| 2015/0206931 | A1 | 7/2015 | Choi et al. |
| 2015/0255618 | A1 | 9/2015 | Chen et al. |
| 2015/0279870 | A1 | 10/2015 | Jiang |
| 2015/0303221 | A1 | 10/2015 | Ning |
| 2015/0303222 | A1 | 10/2015 | Ning |
| 2016/0351643 | A1 | 12/2016 | Xie |
| 2016/0380005 | A1* | 12/2016 | Hou ..................... H10D 86/441 257/72 |
| 2017/0110587 | A1 | 4/2017 | Liu et al. |
| 2017/0170029 | A1 | 6/2017 | Ochi et al. |
| 2017/0373101 | A1 | 12/2017 | Ge |
| 2018/0182836 | A1 | 6/2018 | Beak et al. |
| 2018/0188618 | A1 | 7/2018 | Ge |
| 2018/0267374 | A1* | 9/2018 | Long ................. G02F 1/136213 |
| 2019/0123121 | A1 | 4/2019 | Liu et al. |
| 2019/0273125 | A1 | 9/2019 | Takechi |
| 2019/0280067 | A1 | 9/2019 | Jeong et al. |
| 2020/0098797 | A1 | 3/2020 | Liu et al. |
| 2020/0176604 | A1 | 6/2020 | Xu et al. |
| 2021/0111198 | A1 | 4/2021 | Cho et al. |
| 2021/0367022 | A1 | 11/2021 | Tang |
| 2021/0367081 | A1 | 11/2021 | Yan et al. |
| 2022/0077260 | A1 | 3/2022 | Choo et al. |
| 2022/0320269 | A1 | 10/2022 | Gui et al. |

FOREIGN PATENT DOCUMENTS

| | | | |
|---|---|---|---|
| CN | 103199113 | A | 7/2013 |
| CN | 203423182 | U | 2/2014 |
| CN | 103646966 | A | 3/2014 |
| CN | 103928530 | A | 7/2014 |
| CN | 104078423 | A | 10/2014 |
| CN | 105304646 | A | 2/2016 |
| CN | 105590951 | A | 5/2016 |
| CN | 105629598 | A | 6/2016 |
| CN | 105789320 | A | 7/2016 |
| CN | 103943684 | B | 9/2017 |
| CN | 107452808 | A | 12/2017 |
| CN | 109037297 | A | 12/2018 |
| CN | 109994513 | A | 7/2019 |
| CN | 110649101 | A | 1/2020 |
| CN | 110931510 | A | 3/2020 |
| CN | 111584516 | A | 8/2020 |
| CN | 112366226 | A | 2/2021 |
| CN | 112652645 | A | 4/2021 |
| CN | 113140637 | A | 7/2021 |
| CN | 113937113 | A | 1/2022 |
| CN | 114335020 | A | 4/2022 |
| CN | 115000089 | A | 9/2022 |
| JP | 2020136312 | A | 8/2020 |
| KR | 1020090056117 | A | 6/2009 |
| KR | 20110027470 | A | 3/2011 |
| KR | 1020190131582 | A | 11/2019 |
| KR | 1020200034083 | A | 3/2020 |
| WO | 2012056663 | A1 | 5/2012 |

OTHER PUBLICATIONS

Jul. 7, 2025—(EP) Extended European Search Report—Application No. 22949784.7.

Oct. 16, 2024—(CN) First Office Action—Application No. 202210590935.4 with English Translation.

Jan. 12, 2026—(KR) First Office Action—Application No. 10-2025-7000802 with English Translation.

Oct. 16, 2025—(EP) Extended European Search Report—Application No. 23810761.9.

Jun. 23, 2026—(JP) First Office Action —Application No. 2024-575311 with English Translation.

Jul. 1, 2026—(CN) First Office Action—Application No. 202280002141.X with English Translation.

May 8, 2026—(US) Non-Final Office Action—U.S. Appl. No. 19/414,487.

Jun. 2, 2026—(US) Non-Final Office Action—U.S. Appl. No. 18/702,159.

* cited by examiner

Display device 300

Display substrate 100

FIG. 20

DISPLAY SUBSTRATE, MANUFACTURING METHOD THEREOF, AND DISPLAY DEVICE

This application is a U.S. National Phase Entry of International Application No. PCT/CN2022/104155 filed Jul. 6, 2022, designating the United States of America. The present application claims priority to and the benefit of the above-identified application and the above-identified application is incorporated by reference herein in its entirety.

TECHNICAL FIELD

At least one embodiment of the present disclosure relates to a display substrate, a manufacturing method thereof, and a display device.

BACKGROUND

With continuous development of display technology, organic light emitting diode (OLED) display device has become a research hotspot and technology development direction of major manufacturers due to its advantages of wide color gamut, high contrast, thin and light design, self-illumination, and wide viewing angle.

At present, the organic light emitting diode (OLED) display devices have been widely used in various electronic products, ranging from small electronic products such as smart bracelets, smart watches, smart phones, and tablet computers, to large electronic products such as notebook computers, desktop computers, and televisions. Therefore, the market demand for active matrix organic light emitting diode display devices is also increasing.

SUMMARY

Embodiments of the present disclosure provide a display substrate, manufacturing method thereof, and a display device. The display substrate electrically connects the active layer located at two sides of the second opening with the metal conductive layer through the conductive structure, so that a stable conductive channel with strong current transmission capability is formed between the metal conductive layer and the active layer, and thus various adverse occurrences are avoided.

At least one embodiment of the present disclosure provides a display substrate, which includes: a base substrate; an active layer, located on the base substrate; a gate insulating pattern, located at a side of the active layer away from the base substrate; a metal conductive layer, at least partially located at a side of the gate insulating pattern away from the base substrate; and a conductive structure, the gate insulating pattern includes a first opening, the active layer includes a second opening, an orthographic projection of the second opening on the base substrate is located within an orthographic projection of the first opening on the base substrate, the metal conductive layer includes a main body part and an extension part extending into the first opening, the extension part is electrically connected with the active layer exposed by the first opening, and the conductive structure is overlapped with the extension part, and includes a connection part extending to the second opening and electrically connecting the active layer on two sides of the second opening.

For example, in display substrate provided by an embodiment of the present disclosure, the active layer includes a first conductive part and a second conductive part, the first conductive part and the second conductive part are located at two sides of the second opening in the first direction, and the connection part is located at least partially within the second opening and connects the first conductive part and the second conductive part.

For example, in display substrate provided by an embodiment of the present disclosure, an orthographic projection of the conductive structure on the base substrate covers an orthographic projection of the second opening on the base substrate, and the second opening is completely filled by the connection part.

For example, in display substrate provided by an embodiment of the present disclosure, the conductive structure further includes: a first overlapping part, located at a side of the extension part away from the base substrate, and arranged in direct contact with the extension part; and a second overlapping part, located at a side of the first conductive part away from the base substrate, and arranged in direct contact with the first conductive part, the first overlapping part, the second overlapping part and the connection part are sequentially arranged along the first direction, and are continuously arranged along the first direction.

For example, in display substrate provided by an embodiment of the present disclosure, the conductive structure further includes: a third overlapping part, located at a side of the second conductive part away from the base substrate, and arranged in direct contact with the second conductive part.

For example, in display substrate provided by an embodiment of the present disclosure, the conductive structure further includes: a fourth overlapping part, located at a side of the main body part of the metal conductive layer away from the base substrate, an orthographic projection of the fourth overlapping part on the base substrate is outside the orthographic projection of the first opening on the base substrate.

For example, in display substrate provided by an embodiment of the present disclosure, a value range of a sum of a first dimension of the third overlapping part in the first direction and a second dimension of the fourth overlapping part in the first direction is from 0.5 microns to 1.5 microns.

For example, in display substrate provided by an embodiment of the present disclosure, a first dimension of the third overlapping part in the first direction or a second dimension of the fourth overlapping part in the first direction is smaller than a dimension of the second opening in the first direction.

For example, in display substrate provided by an embodiment of the present disclosure, the first dimension of the third overlapping part in the first direction or the second dimension of the fourth overlapping part in the first direction is smaller than a dimension of the first conductive part in the first direction.

For example, in display substrate provided by an embodiment of the present disclosure, a dimension of the first conductive part in the first direction is smaller than a dimension of the second opening in the first direction.

For example, in display substrate provided by an embodiment of the present disclosure, a dimension of the conductive structure in the first direction is smaller than a dimension of the second conductive part in the first direction.

For example, in display substrate provided by an embodiment of the present disclosure, the metal conductive layer includes a drain electrode and a gate electrode, the drain electrode and the gate electrode are located at two sides of the second opening in the first direction, the drain electrode is arranged in partial contact with the first conductive part, the active layer further includes a channel, located at a side of the second conductive part away from the second opening, and an orthographic projection of the gate electrode on the base substrate is overlapped with an orthographic projection of the channel on the base substrate.

For example, in display substrate provided by an embodiment of the present disclosure, a dimension of the conductive structure in the first direction is smaller than a dimension of the channel in the first direction.

For example, in display substrate provided by an embodiment of the present disclosure, a dimension of a contact region between the drain electrode and the first conductive part in the first direction is larger than a dimension of a contact region between the conductive structure and the active layer in the first direction.

For example, in display substrate provided by an embodiment of the present disclosure, a material of the conductive structure includes transparent conductive oxide.

For example, in display substrate provided by an embodiment of the present disclosure, a thickness of the conductive structure in a second direction perpendicular to the base substrate is greater than a thickness of the active layer in the second direction.

For example, display substrate provided by an embodiment of the present disclosure further including: a buffer layer, located at a side of the active layer close to the base substrate; and a conductive light-shielding layer, located between the buffer layer and the base substrate.

At least one embodiment of the present disclosure further provides a display device, which includes any one of the abovementioned display substrates.

At least one embodiment of the present disclosure further provides a manufacturing method of a display substrate, which includes: sequentially forming an active material layer and a gate insulating layer on a base substrate, patterning the gate insulating layer to form a first gate insulating pattern including an insulating layer opening; performing a first conductor-converting process on the active material layer by using the insulating layer opening; forming a metal material layer at a side of the first gate insulating pattern away from the base substrate; forming a first photoresist pattern including a mask opening, and patterning the metal material layer by using the first photoresist pattern to form a metal conductive layer; patterning the first gate insulating pattern by using the first photoresist pattern, further removing a part of the first gate insulating pattern, to form a second gate insulating pattern, wherein the second gate insulating pattern includes a first opening; performing a second conductor-converting process on the active material layer by using the first photoresist pattern, wherein the active material layer is partially removed during the patterning process of the second gate insulating pattern and the second conductor-converting process to form an active layer, and the active layer includes a second opening; and forming a conductive structure at a side of the metal conductive layer away from the base substrate, an orthographic projection of the second opening on the base substrate is located within an orthographic projection of the first opening on the base substrate, the metal conductive layer includes a main body part and an extension part extending into the first opening, the extension part is electrically connected with the active layer exposed by the first opening, the conductive structure is overlapped with the extension part, and includes a connection part extending to the second opening and electrically connecting the active layer on two sides of the second opening.

For example, in the manufacturing method of a display substrate provided by an embodiment of the present disclosure, forming a conductive structure at a side of the metal conductive layer away from the base substrate includes: removing the first photoresist pattern, and forming a second photoresist pattern at a side of the metal conductive layer away from the base substrate; forming a conductive layer at a side of the second photoresist pattern away from the base substrate; and stripping the second photoresist pattern, and stripping the conductive layer located on the second photoresist pattern, wherein the remaining conductive layer forms the conductive structure.

For example, in the manufacturing method of a display substrate provided by an embodiment of the present disclosure, patterning the gate insulating layer to form the first gate insulating pattern including the insulating layer openings includes: forming a third photoresist pattern at a side of the gate insulating layer away from the base substrate by using a first mask; and patterning the gate insulating layer by using the third photoresist pattern to form the first gate insulating pattern.

For example, in the manufacturing method of a display substrate provided by an embodiment of the present disclosure, forming the second photoresist pattern at a side of the metal conductive layer away from the base substrate includes: using the first mask to form the second photoresist pattern at the side of the metal conductive layer away from the base substrate.

For example, in the manufacturing method of a display substrate provided by an embodiment of the present disclosure, an overlapping part of an orthographic projection of the insulating layer opening on the base substrate and an orthographic projection of the mask opening on the base substrate substantially coincides with the orthographic projection of the second opening on the base substrate.

For example, in the manufacturing method of a display substrate provided by an embodiment of the present disclosure, the active layer includes a first conductive part and a second conductive part, the first conductive part and the second conductive part are located at two sides of the second opening in the first direction, and the connection part is located at least partially within the second opening and connects the first conductive part and the second conductive part.

For example, in the manufacturing method of a display substrate provided by an embodiment of the present disclosure, an orthographic projection of the conductive structure on the base substrate cover the orthographic projection of the second opening on the base substrate, and the second opening is completely filled by the connection part.

BRIEF DESCRIPTION OF DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

FIG. 20 is a schematic diagram of a display device provided by an embodiment of the present disclosure.

DETAILED DESCRIPTION

In order to make objectives, technical details, and advantages of the embodiments of the present disclosure clearer, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms “first”, “second”, etc., which are used in the present disclosure, are not intended to indicate any sequence, amount or importance, but distinguish various components. Also, the terms “comprise,” “comprising.” “include,” “including.” etc., are intended to specify that the elements or the objects stated before these terms encompass the elements or the objects and equivalents thereof listed after these terms, but do not preclude the other elements or objects. The phrases “connect”, “connected”, etc., are not intended to define a physical connection or mechanical connection, but may include an electrical connection, directly or indirectly.

An organic light emitting diode (OLED) display device generally includes a display substrate arranged with a driving circuit and a light emitting element, the driving circuit on the display substrate can drive the light emitting element to perform light emitting display. In a manufacturing method of a display substrate, because the active material layer is subjected to two etching processes, as a result, partial deletions occur, leading to various defects.

Figure 1:
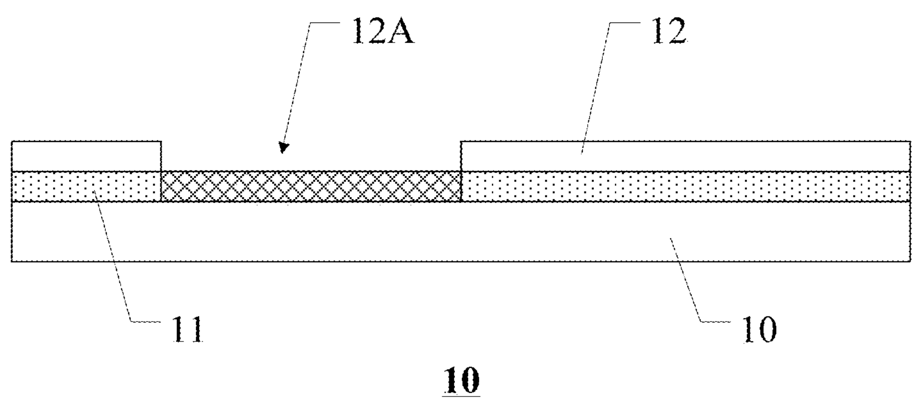
FIG. 1 to FIG. 3 are schematic diagrams of steps of a manufacturing method of a display substrate.
Figure 2:
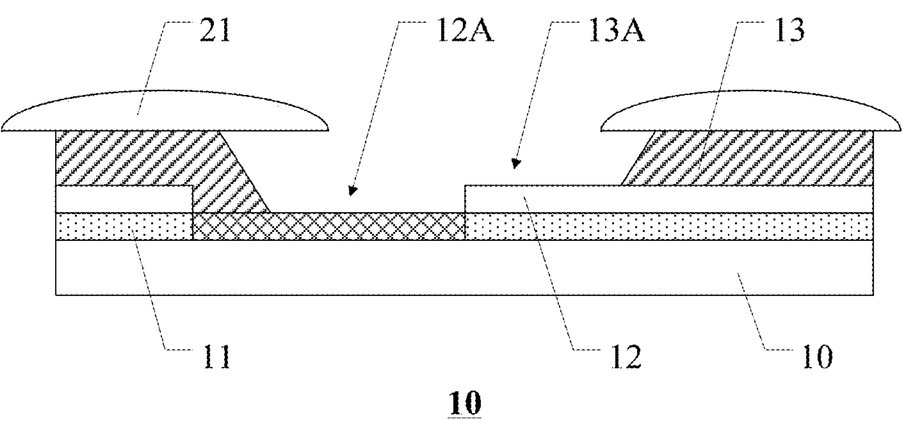
Figure 3:
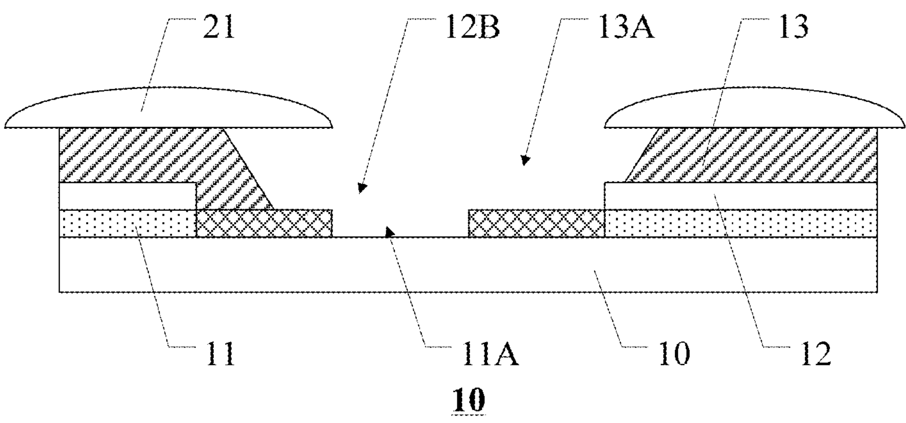
Figure 4:
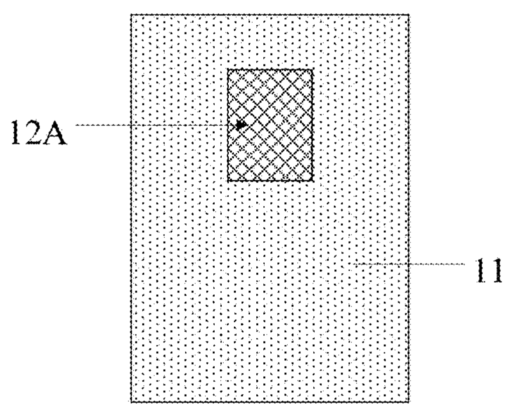
FIG. 4 is a partial planar schematic diagram of the display substrate shown in FIG. 1.
Figure 5:
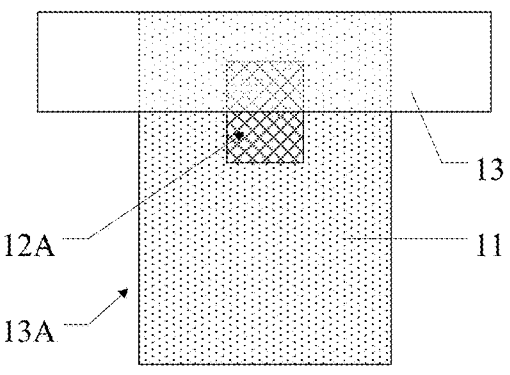
FIG. 5 is a partial planar schematic diagram of the display substrate shown in FIG. 2.
Figure 6:
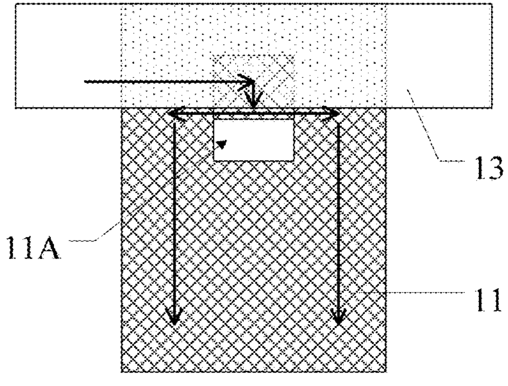
FIG. 6 is a partial planar schematic diagram of the display substrate shown in FIG. 3.

FIG. 1 to FIG. 3 are schematic diagrams of steps of a manufacturing method of a display substrate; FIG. 4 is a partial planar schematic diagram of the display substrate shown in FIG. 1; FIG. 5 is a partial planar schematic diagram of the display substrate shown in FIG. 2; and FIG. 6 is a partial planar schematic diagram of the display substrate shown in FIG. 3.

As illustrated by FIG. 1, forming an active material layer 11 and a gate insulating layer 12 on a base substrate 10; performing an etching process on the gate insulating layer 12 to form an opening 12A in the gate insulating layer 12; then the exposed active material layer 11 is processed to be conductive by using the opening 12A as formed; during this process, the part of the active material layer 11 exposed by the opening 12A undergoes an etching process and a conductor-converting process. In this case, as illustrated by FIG. 4, the active material layer 11 exposed by the opening 12A undergoes a conductor-converting process. It should be noted that the abovementioned etching process is not an etching process for the active material layer, but an etching process for the gate insulating layer (such as a dry etching process), but the abovementioned etching process will cause some damage to the exposed active material layer 11.

As illustrated by FIG. 2, forming a metal material layer 13 on the display substrate shown in FIG. 1; forming a photoresist pattern 21 on the metal material layer 13, and using the photoresist pattern 21 to etch the metal material layer 13, thereby forming an opening 13A in the metal material layer 13. In this case, as illustrated by FIG. 5, the metal material layer 13 forms a metal conductive layer (such as a gate electrode or a gate line) overlapping with a part of the active material layer 11; and the region outside the metal conductive layer is a region corresponding to the opening 13A.

As illustrated by FIG. 3, remaining the abovementioned photoresist pattern 21, and using the photoresist pattern 21 to etch the gate insulating layer 12, thereby expanding the abovementioned opening 12A into an opening 12B; then the exposed active material layer 11 is processed to be conductive by using the opening 12B. During this process, the active material layer 11 has undergone two etching processes and two conductor-converting processes in an overlapping region of the opening 12A and the opening 13A, thus a defect (a part shown by the notch 11A) is generated. In this case, as illustrated by FIG. 6, in the process of etching the gate insulating layer 12 by using the photoresist pattern 21, the active material layer 11 is missing (the part shown by the notch 11A), the conductive channel formed by an overlapping of the conductive active material layer and the metal conductive layer is very narrow (for example, its width is less than or equal to 0.7 microns). In this case, the current or electrical signal is restricted in the process of passing from the metal conductive layer to the active material layer, so that defects such as signal delay, tip discharge, and short circuit are likely to occur. It should be noted that arrows in FIG. 6 indicate transmission directions of the current.

In this regard, in order to avoid the occurrence of the abovementioned defects, embodiments of the present disclosure provide a display substrate, manufacturing method thereof, and a display device. The display substrate includes a base substrate, an active layer, a gate insulating pattern, a metal conductive layer and a conductive structure. The active layer is located on the base substrate; the gate insulating pattern is located at a side of the active layer away from the base substrate; and the metal conductive layer is at least partially located at a side of the gate insulating pattern away from the base substrate. The gate insulating pattern includes a first opening, the active layer includes a second opening, an orthographic projection of the second opening on the base substrate is located within an orthographic projection of the first opening on the base substrate; the metal conductive layer includes a main body part and an extension part extending into the first opening, the extension part is electrically connected with the active layer exposed by the first opening, the conductive structure is overlapped with the extension part, and includes a connection part extending to the second opening and electrically connecting the active layer on two sides of the second opening. In this way, the display substrate electrically connects the active layer located at two sides of the second opening with the metal conductive layer through the abovementioned conductive structure, so that a stable conductive channel with strong current transmission capability is formed between the metal conductive layer and the active layer, and thus various defects are avoided.

Hereinafter, the display substrate, manufacturing method thereof, and the display device provided by the embodiments of the present disclosure will be described in detail with reference to the accompanying drawings.

Figure 7:
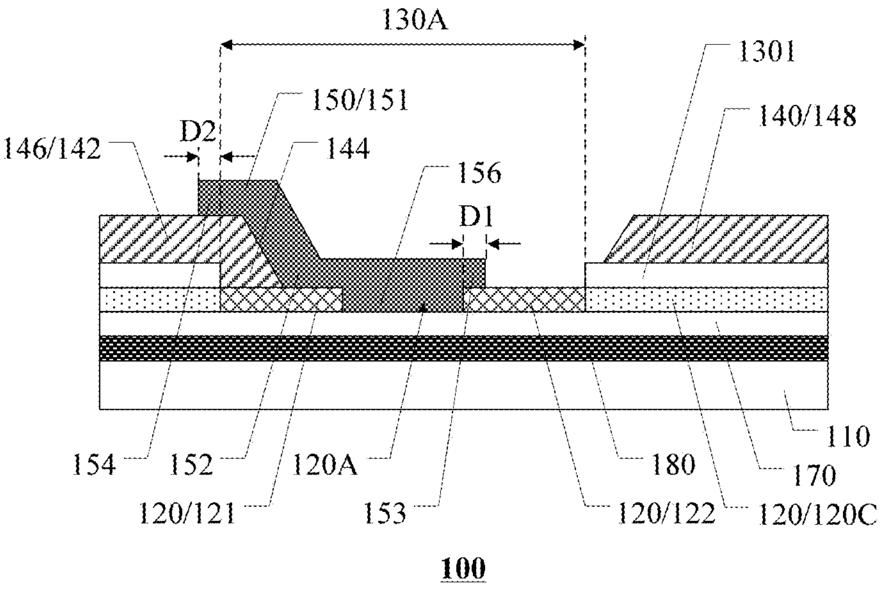
FIG. 7 is a cross-sectional schematic diagram of a display substrate provided by an embodiment of the present disclosure.

An embodiment of the present disclosure provides a display substrate. FIG. 7 is a cross-sectional schematic diagram of a display substrate provided by an embodiment of the present disclosure; and FIG. 8 is a partial planar schematic diagram of a display substrate provided by an embodiment of the present disclosure;

As illustrated by FIG. 7, the display substrate 100 includes a base substrate 110, an active layer 120, a gate insulating pattern 130, a metal conductive layer 140 and a conductive structure 150. The active layer 120 is located on the base substrate 110; the gate insulating pattern 130 is located at a side of the active layer 120 away from the base substrate 110; the metal conductive layer 140 is at least partially located at a side of the gate insulating pattern 130 away from the base substrate 110. The gate insulating pattern 130 includes a first opening 130A, the active layer 120 includes a second opening 120A, an orthographic projection of the second opening 120A on the base substrate 110 is located within an orthographic projection of the first opening 130A on the base substrate 110; the metal conductive layer 140 includes a main body part 142 and an extension part 144 extending into the first opening 130A, the extension part 144 is electrically connected with the active layer 120 exposed by the first opening 130A, the conductive structure 150 is overlapped with the extension part 144, and includes a connection part 156 extending to the second opening 120A and electrically connecting the active layer 120 on two sides of the second opening 120A. It should be noted that the abovementioned second opening 120A is equivalent to the missing part of the active material layer in the display substrate shown in FIG. 3 and FIG. 6; in addition, the active layer 120 exposed by the first opening 130A may be a conductive semiconductor material, which can conduct electricity.

In the display substrate provided by the embodiment of the present disclosure, the conductive structure is overlapped with the extension part, and includes a connection part extending to the second opening and electrically connecting the active layer on two sides of the second opening, therefore, the display substrate electrically connects the active layer located at two sides of the second opening with the metal conductive layer through the abovementioned conductive structure, so that a stable conductive channel with strong current transmission capability is formed between the metal conductive layer and the active layer, and thus various defects are avoided.

Figure 8:
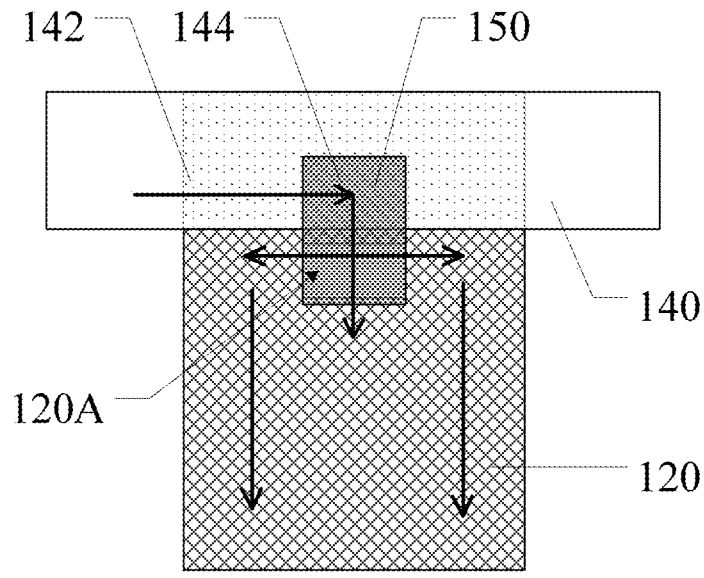
FIG. 8 is a partial planar schematic diagram of a display substrate provided by an embodiment of the present disclosure.

As illustrated by FIG. 8, compared with the display substrate shown in FIG. 6, the current or electrical signal can be transmitted through the conductive channel formed by the metal conductive layer, the conductive structure and the active layer; and because the conductive channel formed by the metal conductive layer, the conductive structure and the active layer has a relatively large width, lower resistance and higher stability are provided.

For example, the abovementioned metal conductive layer may be a gate layer in an array substrate.

In some examples, as illustrated by FIG. 7 and FIG. 8, the abovementioned extension part 144 is an extension part with respect to the first opening 130A, and is not necessarily a protruding part extending from the metal conductive layer 140. In addition, after the first opening 130A is formed, the active layer 120 may be subjected to a conductor-converting process using the first opening 130A, so that the active layer 120 exposed by the first opening 130A has conductivity. It should be noted that the abovementioned conductor-converting process may include a doping process.

In some examples, as illustrated by FIG. 7, the active layer 120 includes a first conductive part 121 and a second conductive part 122, the first conductive part 121 and the second conductive part 122 are located at two sides of the second opening 120A in the first direction, the connection part 156 is at least partially located within the second opening 120A and connects the first conductive part 121 and the second conductive part 122. It should be noted that the abovementioned first direction may be a direction parallel to the base substrate. In this way, the connection part can make up for the missing part of the active layer in the second opening, and electrically connects the first conductive part and the second conductive part.

In some examples, as illustrated by FIG. 7, the orthographic projection of the conductive structure 150 on the base substrate 110 covers the orthographic projection of the second opening 120A on the base substrate 110, and the second opening 120A is completely filled with the connection part 156. That is, the connection part 156 not only connects the first conductive part 121 and the second conductive part 122 located at two sides of the second opening 120A, but also completely fills the second opening 120A.

In some examples, as illustrated by FIG. 7, the conductive structure 150 further includes a first overlapping part 151 and a second overlapping part 152; the first overlapping part 151 is located at a side of the extension part 144 away from the base substrate 110, and is arranged in direct contact with the extension part 144; the second overlapping part 152 is located at a side of the first conductive part 121 away from the base substrate 110, and is arranged in direct contact with the first conductive part 121; the first overlapping part 151, the second overlapping part 152 and the connection part 156 are sequentially arranged along the first direction and are arranged continuously along the first direction. In this way, the conductive structure is electrically connected with the extension part and the first conductive part respectively through the first overlapping part and the second overlapping part, so that current transmission capability of the conductive channel formed by the metal conductive layer, the conductive structure and the active layer is further increased.

In some examples, as illustrated by FIG. 7, the conductive structure 150 can be etched by using a mask of the gate insulating pattern 130, so that there is no need to add a mask process, so as to reduce the cost. In this case, the conductive structure 150 may just include the first overlapping part 151, the second overlapping part 152 and the connection part 156 mentioned above, so that the current transmission capability of the conductive channel formed by the metal conductive layer, the conductive structure and the active layer can also be improved while reducing the cost.

In some examples, as illustrated by FIG. 7, the conductive structure 150 further includes a third overlapping part 153, which is located at a side of the second conductive part 122 away from the base substrate 110, and is arranged in direct contact with the second conductive part 122. The third overlapping part can further improve the current transmission capability of the conductive channel formed by the metal conductive layer, the conductive structure and the active layer.

In some examples, as illustrated by FIG. 7, the conductive structure 150 further includes a fourth overlapping part 154, which is located at a side of the main body part 142 of the metal conductive layer 140 away from the base substrate 110, the orthographic projection of the fourth overlapping part 154 on the base substrate 110 is outside the orthographic projection of the first opening 130A on the base substrate 110. The fourth overlapping part can further improve the current transmission capability of the conductive channel formed by the metal conductive layer, the conductive structure and the active layer.

In some examples, as illustrated by FIG. 7, the sum of the first dimension D1 of the third overlapping part 153 in the first direction and the second dimension D2 of the fourth overlapping part 154 in the first direction ranges from 0.5 μm to 1.5 μm. In this way, the third overlapping part and the fourth overlapping part can effectively improve the current transmission capability of the conductive channel formed by the metal conductive layer, the conductive structure and the active layer.

In some examples, as illustrated by FIG. 7, the first dimension D1 of the third overlapping part 153 in the first direction or the second dimension D2 of the fourth overlapping part 154 in the first direction is smaller than the dimension of the second opening 120A in the first direction.

In some examples, as illustrated by FIG. 7, the first dimension D1 of the third overlapping part 153 in the first direction or the second dimension D2 of the fourth overlapping part 154 in the first direction is smaller than the dimension of the first conductive part 121 in the first direction.

In some examples, as illustrated by FIG. 7, the dimension of the first conductive part 121 in the first direction is smaller than the dimension of the second opening 120A in the first direction.

In some examples, as illustrated by FIG. 7, the dimension of the conductive structure 150 in the first direction is smaller than the dimension of the second conductive part 122 in the first direction.

In some examples, as illustrated by FIG. 7, the metal conductive layer 140 includes a drain electrode 146 and a gate electrode 148, the drain electrode 146 and the gate electrode 148 are located at two sides of the second opening 120A in the first direction, the drain electrode 146 is arranged in partial contact with the first conductive part 121; the active layer 120 further includes a channel 120C located at a side of the second conductive part 122 away from the second opening 120A, an orthographic projection of the gate electrode 148 on the base substrate 110 is overlapped with an orthographic projection of the channel 148 on the base substrate 110. It should be noted that the abovementioned drain electrode 146 may include the abovementioned main body part 142 and the extension part 144 extending into the first opening 130A.

In some examples, as illustrated by FIG. 7, the dimension of the conductive structure 150 in the first direction is smaller than the dimension of the channel 120C in the first direction.

In some examples, as illustrated by FIG. 7, a dimension of a contact region between the drain electrode 146 and the first conductive part 121 in the first direction is larger than a dimension in the first direction of a contact region between the conductive structure 150 and the active layer 120. In some examples, as illustrated by FIG. 7, a thickness of the conductive structure 150 in the second direction perpendicular to the base substrate 110 is greater than a thickness of the active layer 120 in the second direction. In this way, a conductive structure with a larger thickness can make the resistance of the conductive structure smaller, so that the current transmission capability of the conductive channel formed by the metal conductive layer, the conductive structure and the active layer is further improved. On the other hand, the thicker conductive structure can avoid breakage at edges of the first opening, so that a more stable electrical connection is provided.

In some examples, as illustrated by FIG. 7, the display substrate 100 further includes a buffer layer 170 and a conductive light-shielding layer 180; the buffer layer 170 is located at a side of the active layer 120 close to the base substrate 110; the conductive light-shielding layer 180 is located between the buffer layer 170 and the base substrate 110. In this way, the buffer layer can protect the conductive light-shielding layer in a case that the active layer is etched and has a defect.

In some examples, material of the conductive structure 150 includes transparent conductive oxide, for example, indium tin oxide (ITO). Of course, the embodiments of the present disclosure include but are not limited thereto, and other conductive materials may also be used for the conductive structure.

In some examples, material of the active layer 120 includes an oxide semiconductor, such as indium gallium zinc oxide (IGZO); of course, the embodiments of the present disclosure include but are not limited thereto, and other semiconductor materials may also be used for the active layer.

Figure 9:
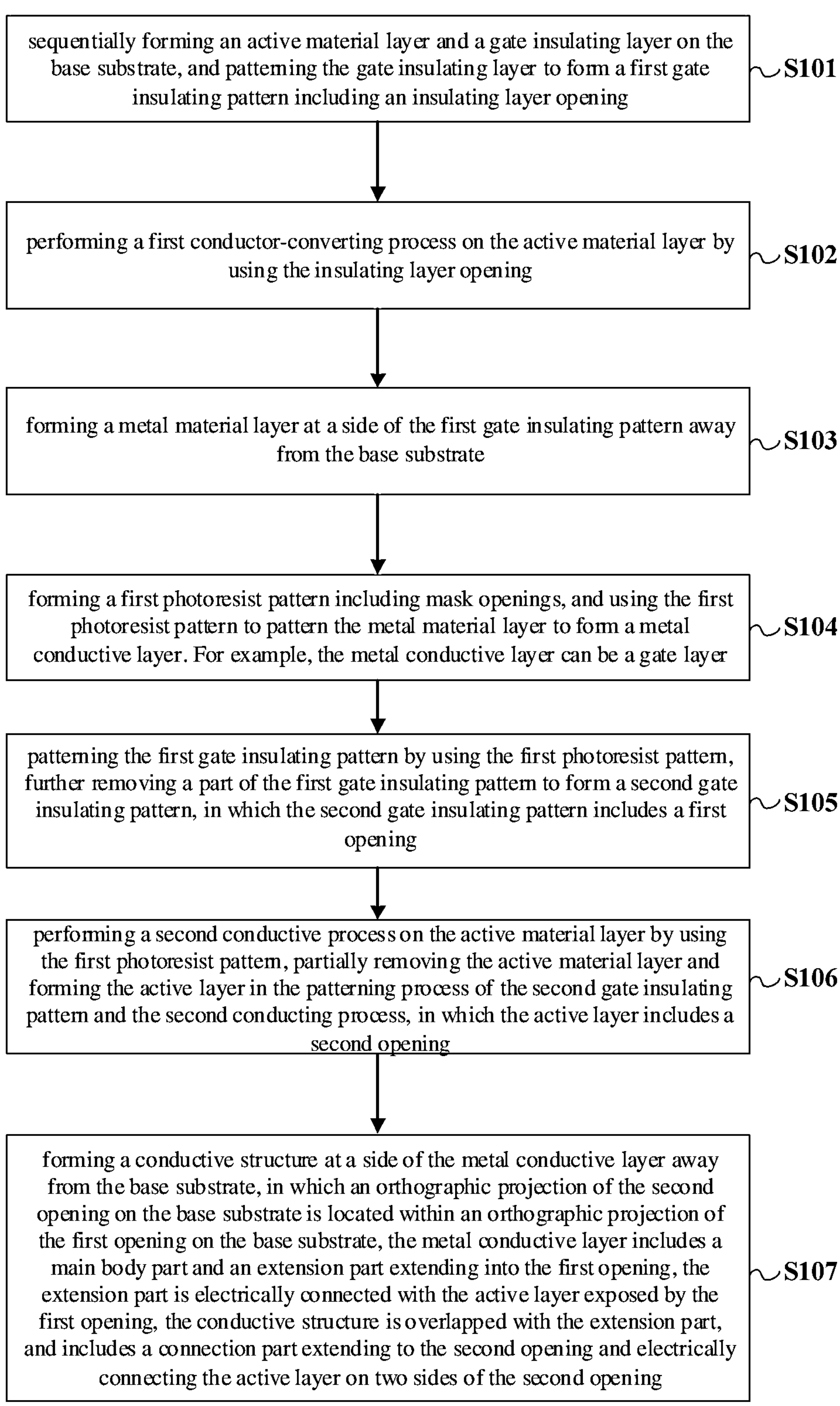
FIG. 9 is a flow schematic diagram of a manufacturing method of a display substrate provided by an embodiment of the present disclosure.

At least one embodiment of the present disclosure further provides a manufacturing method of a display substrate. FIG. 9 is a flow schematic diagram of a manufacturing method of a display substrate provided by an embodiment of the present disclosure. As illustrated by FIG. 9, the manufacturing method of the display substrate includes the following steps S101 to S106.

Step S101: sequentially forming an active material layer and a gate insulating layer on the base substrate, and patterning the gate insulating layer to form a first gate insulating pattern including an insulating layer opening.

For example, the base substrate can be a transparent substrate such as a glass substrate, a quartz substrate, or a plastic substrate; of course, the embodiments of the present disclosure include but are not limited thereto, and the base substrate may also be a silicon-based semiconductor substrate.

For example, the material of the gate insulating layer may be one or more of silicon oxide, silicon nitride, and silicon oxynitride.

For example, the abovementioned active material layer can be an oxide semiconductor, such as indium gallium zinc oxide (IGZO). Of course, the embodiments of the present disclosure include but are not limited thereto, and the active material layer may also use other semiconductor materials.

Step S102: performing a first conductor-converting process on the active material layer by using the insulating layer opening.

For example, the abovementioned first conductor-converting process may be a doping process to convert the active material layer into a conductor.

Step S103: forming a metal material layer at a side of the first gate insulating pattern away from the base substrate.

For example, material of the metal material layer may be conductive metal materials such as molybdenum, aluminum, silver, copper and gold. Of course, embodiments of the present disclosure include but are not limited thereto. It should be noted that the abovementioned metal material layer may be a metal material layer forming the gate layer in the array substrate.

Step S104: forming a first photoresist pattern including mask openings, and using the first photoresist pattern to pattern the metal material layer to form a metal conductive layer. For example, the metal conductive layer can be a gate layer.

For example, the first photoresist pattern can be formed by first coating a photoresist material, and then using a mask plate for exposure and development. Of course, the embodiments of the present disclosure include but are not limited thereto, and the first photoresist pattern can also be formed in other ways.

Step S105: patterning the first gate insulating pattern by using the first photoresist pattern, further removing a part of the first gate insulating pattern to form a second gate insulating pattern, in which the second gate insulating pattern includes a first opening.

For example, the abovementioned patterning process may include an etching process, such as a dry etching process, and plasma bombardment. Of course, embodiments of the present disclosure include but are not limited thereto.

Step S106: performing a second conductive process on the active material layer by using the first photoresist pattern, partially removing the active material layer and forming the active layer in the patterning process of the second gate insulating pattern and the second conducting process, in which the active layer includes a second opening.

For example, the abovementioned second conductor-converting process may also be a doping process.

Step S107: forming a conductive structure at a side of the metal conductive layer away from the base substrate, in which an orthographic projection of the second opening on the base substrate is located within an orthographic projection of the first opening on the base substrate, the metal conductive layer includes a main body part and an extension part extending into the first opening, the extension part is electrically connected with the active layer exposed by the first opening, the conductive structure is overlapped with the extension part, and includes a connection part extending to the second opening and electrically connecting the active layer on two sides of the second opening.

In the manufacturing method of the display substrate provided by the embodiment of the present disclosure, the conductive structure is overlapped with the extension part and includes a connection part extending to the second opening and electrically connecting the active layer on two sides of the second opening, therefore, the display substrate electrically connects the active layer located at two sides of the second opening with the metal conductive layer through the abovementioned conductive structure, so that a stable conductive channel with strong current transmission capability is formed between the metal conductive layer and the active layer, and thus the occurrence of various defects can be avoided. For the beneficial effects mentioned above, reference may be made to the relevant description of FIG. 8, which will not be repeated herein.

In some examples, the abovementioned conductive structure can be manufactured by using a mask for forming the first gate insulating pattern, so that the mask board can be saved. Of course, embodiments of the present disclosure include but are not limited thereto.

Figure 10:
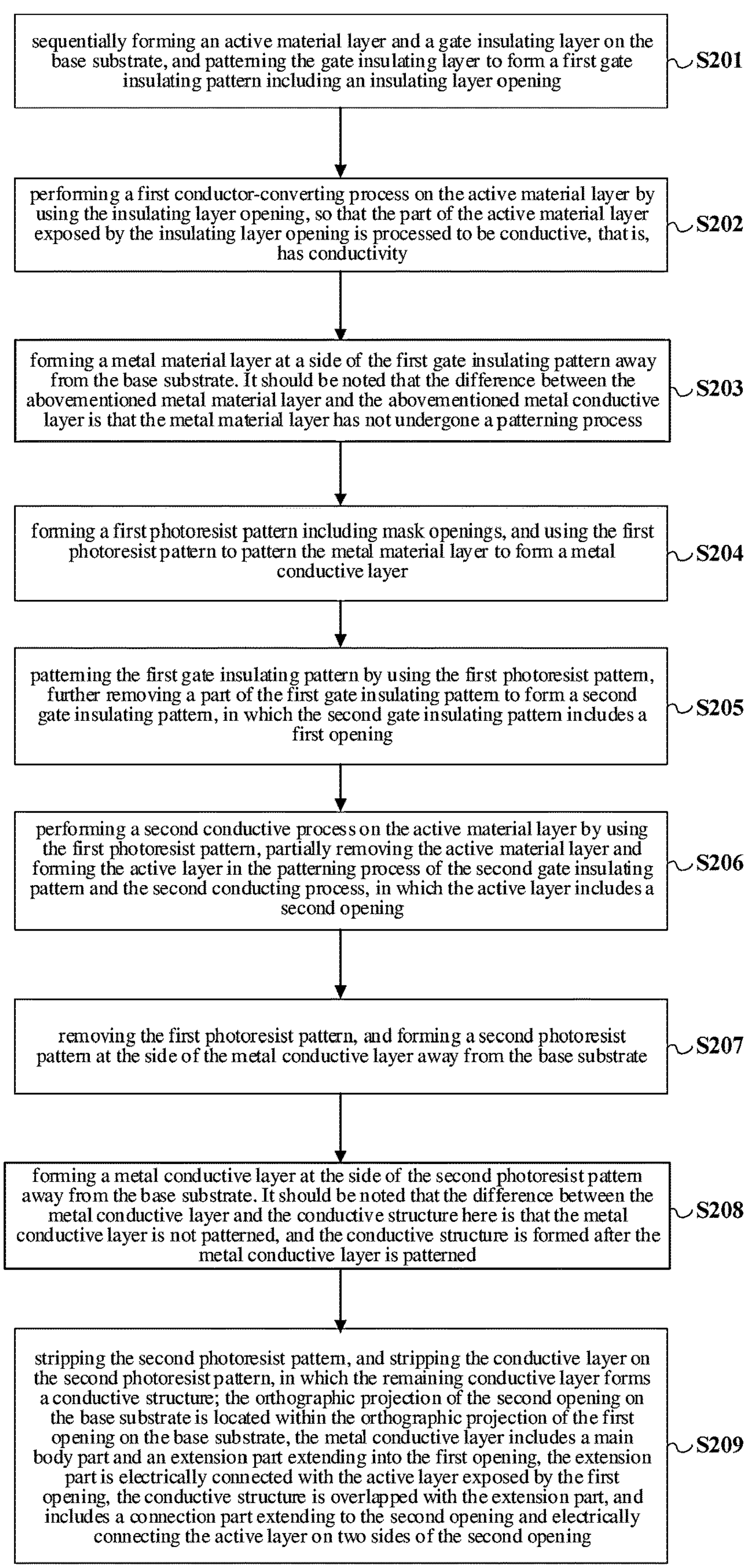
FIG. 10 is a flow schematic diagram of another manufacturing method of a display substrate provided by an embodiment of the present disclosure.

At least one embodiment of the present disclosure further provides a manufacturing method of a display substrate. FIG. 10 is a flow schematic diagram of another manufacturing method of a display substrate provided by an embodiment of the present disclosure; and FIG. 11 to FIG. 19 are schematic diagrams of steps of a manufacturing method of a display substrate provided by an embodiment of the present disclosure.

As illustrated by FIG. 10, the manufacturing method of the display substrate includes the following steps S201 to S209.

Step S201: sequentially forming an active material layer and a gate insulating layer on the base substrate, and patterning the gate insulating layer to form a first gate insulating pattern including an insulating layer opening.

Figure 11:
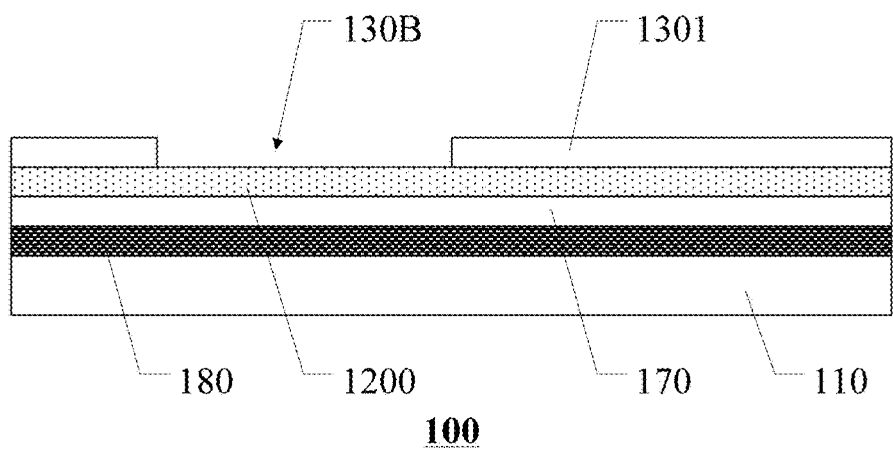
FIG. 11 to FIG. 19 are schematic diagrams of steps of a manufacturing method of a display substrate provided by an embodiment of the present disclosure.

As illustrated by FIG. 11, an active material layer 1200 and a first gate insulating pattern 1301 are formed on the base substrate 110; and the first gate insulating pattern 1301 includes an insulating layer opening 130B. It should be noted that the difference between the abovementioned active material layer and the abovementioned active layer is that the active material layer has not undergone etching and conductor-converting processes.

Step S202: performing a first conductor-converting process on the active material layer by using the insulating layer opening, so that the part of the active material layer exposed by the insulating layer opening is processed to be conductive, that is, has conductivity. It should be noted that the body material of the active material layer is a semiconductor material, which can have conductivity after a conductor-converting process.

Figure 12:
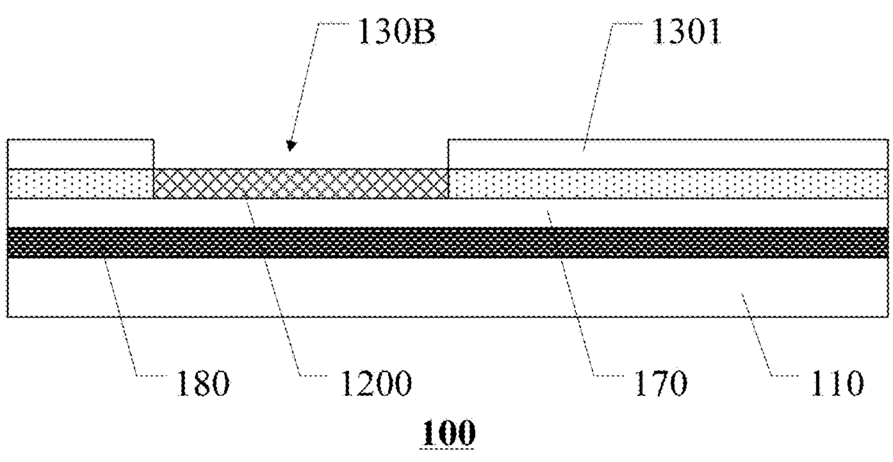

As illustrated by FIG. 12, the active material layer 1200 is subjected to a first conductor-converting process (such as a doping process) using an insulating layer opening 130B, so that the part of the active material layer 1200 exposed by the insulating layer opening 130B has conductivity.

Step S203: forming a metal material layer at a side of the first gate insulating pattern away from the base substrate. It should be noted that the difference between the abovementioned metal material layer and the abovementioned metal conductive layer is that the metal material layer has not undergone a patterning process.

Figure 13:
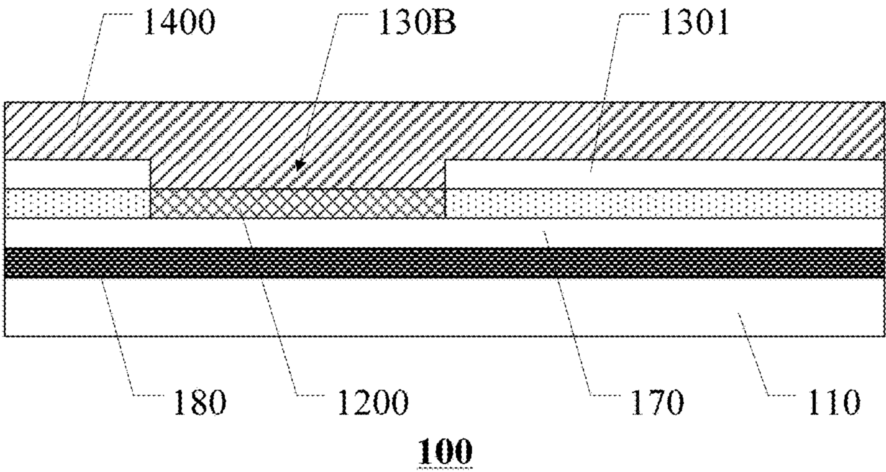

As illustrated by FIG. 13, a metal material layer 1400 is formed at a side of the first gate insulating pattern 1301 away from the base substrate 110. In this case, the metal material layer 1400 is arranged in contact with the active material layer 1200 exposed by the insulating layer opening 130B.

Step S204: forming a first photoresist pattern including mask openings, and using the first photoresist pattern to pattern the metal material layer to form a metal conductive layer.

Figure 14:
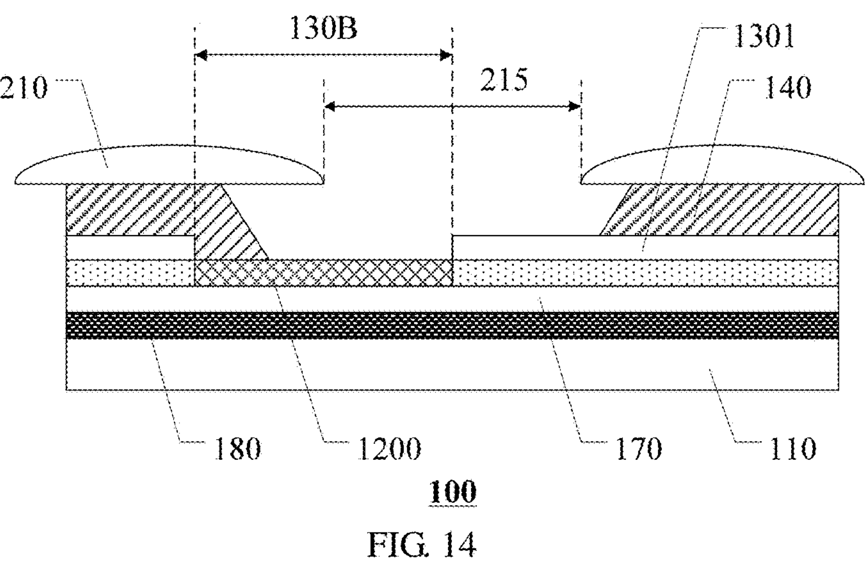

As illustrated by FIG. 14, a first photoresist pattern 210 is formed at a side of the metal material layer 1400 away from the base substrate 110, and the first photoresist pattern 210 includes a mask opening 215. The metal material layer 1400 is patterned by using the first photoresist pattern 210 to form the metal conductive layer 140. In this case, the metal conductive layer 140 is the same as the metal conductive layer in the abovementioned embodiment of the display substrate. It should be noted that because the metal conductive layer can be formed by a wet etching process, a dimension of the opening in the metal conductive layer is larger than a dimension of the mask opening.

Step S205: patterning the first gate insulating pattern by using the first photoresist pattern, further removing a part of the first gate insulating pattern to form a second gate insulating pattern, in which the second gate insulating pattern includes a first opening.

Figure 15:
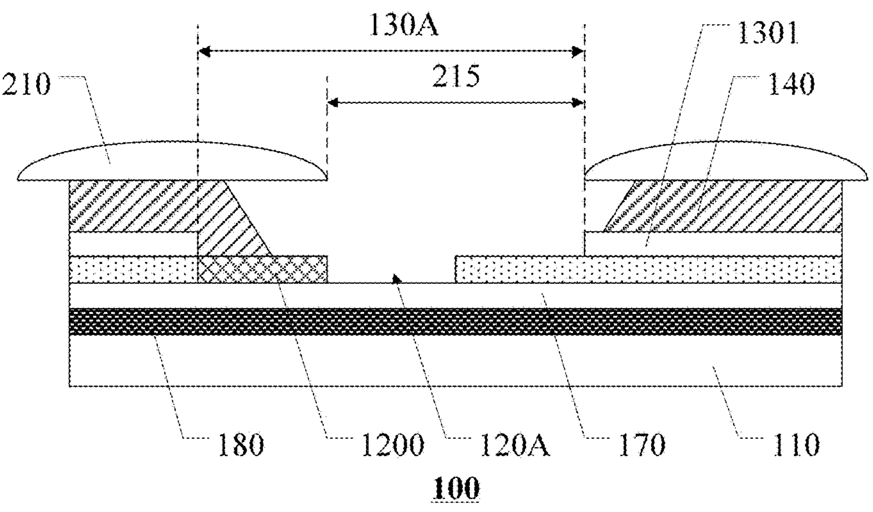

As illustrated by FIG. 15, the first gate insulating pattern 1301 is patterned by using the first photoresist pattern 210, and a part of the first gate insulating pattern 1301 is further removed to form a second gate insulating pattern 130, in which the second gate insulating pattern 130 includes a first opening 130A. The first opening 130A is enlarged on the basis of the insulating layer 130B, so the first opening 130A is larger than the abovementioned insulating layer opening 130B.

Step S206: performing a second conductive process on the active material layer by using the first photoresist pattern, partially removing the active material layer and forming the active layer in the patterning process of the second gate insulating pattern and the second conducting process, in which the active layer includes a second opening.

Figure 16:
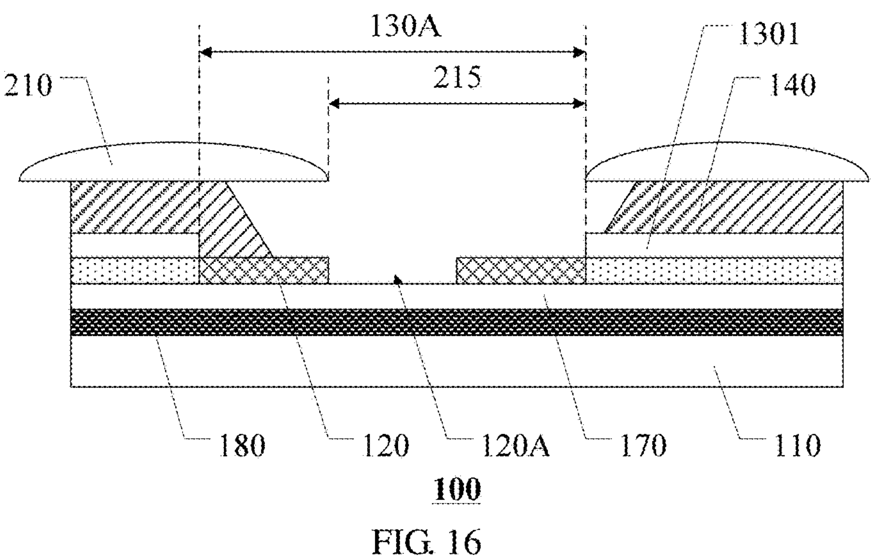

As illustrated by FIG. 16, the second conductor-converting process is performed on the active material layer 1200 by using the first photoresist pattern 210, so that the active material layer 1200 exposed by the mask opening 215 is processed to be conductive. In this case, because an overlapping region is provided between the mask opening 215 and the insulating layer opening 130B, the active material layer 1200 located in the overlapping region will undergo two patterning processes and two conductor-converting processes, which are prone to defects, so that the second opening 120A is formed. It should be noted that the abovementioned second opening may also be formed in the process of patterning the first gate insulating pattern, or the abovementioned second opening is formed after performing a second conductor-converting process on the active material layer.

Step S207: removing the first photoresist pattern, and forming a second photoresist pattern at the side of the metal conductive layer away from the base substrate.

Figure 17:
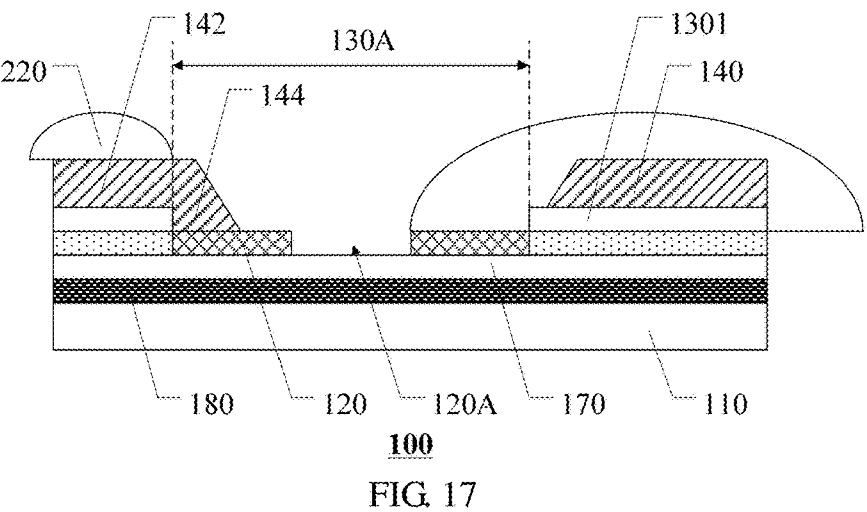

As illustrated by FIG. 17, the first photoresist pattern 210 is removed, and a second photoresist pattern 220 is formed at the side of the metal conductive layer 140 away from the base substrate 110.

Step S208: forming a metal conductive layer at the side of the second photoresist pattern away from the base substrate. It should be noted that the difference between the metal conductive layer and the conductive structure here is that the metal conductive layer is not patterned, and the conductive structure is formed after the metal conductive layer is patterned.

Figure 18:
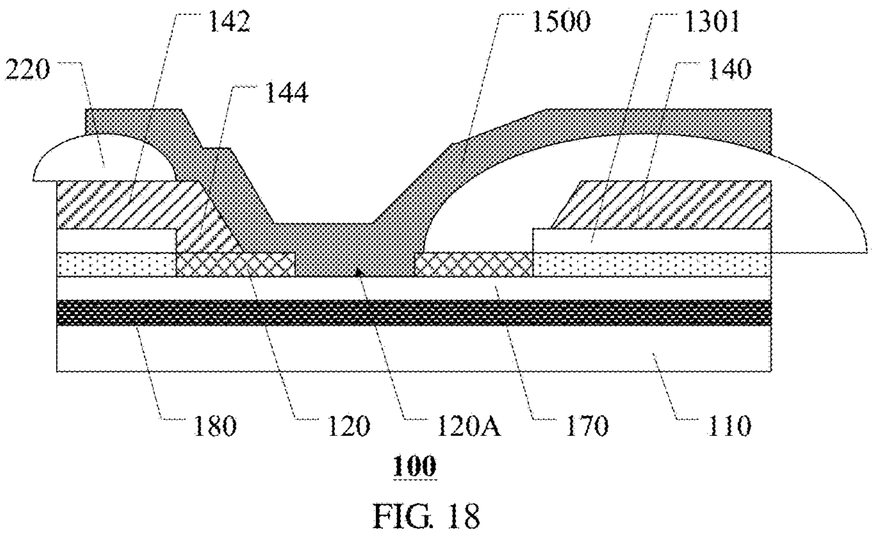

As illustrated by FIG. 18, a conductive layer 1500 is formed at a side of the second photoresist pattern 220 away from the base substrate 110.

Step S209: stripping the second photoresist pattern, and stripping the conductive layer on the second photoresist pattern, in which the remaining conductive layer forms a conductive structure; the orthographic projection of the second opening on the base substrate is located within the orthographic projection of the first opening on the base substrate, the metal conductive layer includes a main body part and an extension part extending into the first opening, the extension part is electrically connected with the active layer exposed by the first opening, the conductive structure is overlapped with the extension part, and includes a connection part extending to the second opening and electrically connecting the active layer on two sides of the second opening.

Figure 19:
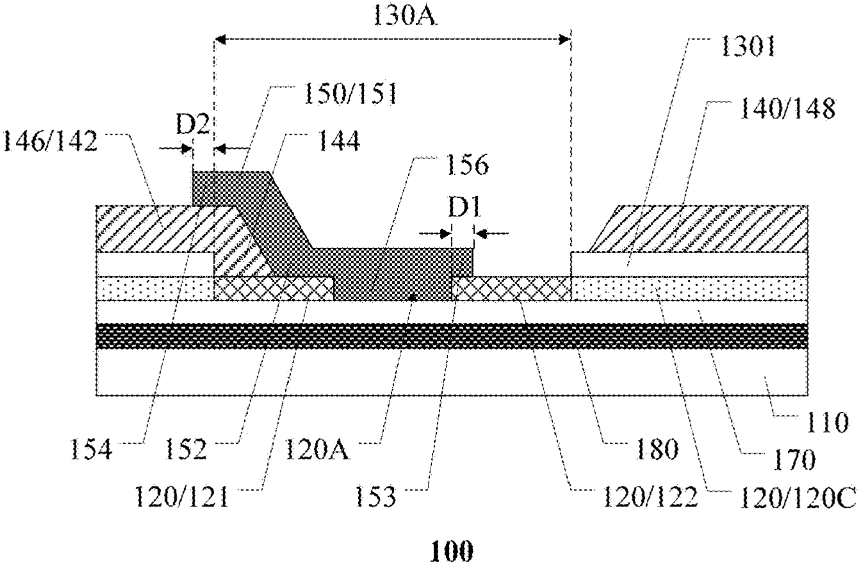

As illustrated by FIG. 19, the second photoresist pattern 220 is stripped off, and the conductive layer 1500 located on the second photoresist pattern 220 is stripped off together, in which the remaining conductive layer 1500 forms the conductive structure 150. In this case, the orthographic projection of the second opening 120A on the base substrate 110 is located within the orthographic projection of the first opening 130A on the base substrate 110, the metal conductive layer 140 includes a main body part 142 and an extension part 144 extending into the first opening 130A, the extension part 144 is electrically connected with the active layer 120 exposed by the first opening 130A, the conductive structure 150 is overlapped with the extension part 144, and includes a connection part 152 extending to the second opening 120A and electrically connecting the active layer 120 on two sides of the second opening 120A.

In the manufacturing method of the display substrate provided by the embodiment of the present disclosure, the conductive structure is overlapped with the extension part and includes a connection part extending to the second opening and electrically connecting the active layer on two sides of the second opening, therefore, the display substrate electrically connects the active layer located at two sides of the second opening with the metal conductive layer through the abovementioned conductive structure, so that a stable conductive channel with strong current transmission capability is formed between the metal conductive layer and the active layer, and thus various defects are avoided. The beneficial effects mentioned above can refer to the relevant descriptions of FIG. 8, which will not be repeated herein.

In addition, because the conductive structure is formed by stripping the second photoresist pattern, no etching process is used, the cost can be further reduced and the formed display substrate can be protected from being affected by the etching process. Of course, the embodiments of the present disclosure include but are not limited thereto, and the conductive layer may also be formed first, then the abovementioned second photoresist pattern is formed, and finally the conductive layer is formed into the abovementioned conductive structure by using the second photoresist pattern through an etching process.

In some examples, as illustrated by FIG. 19, in the display substrate formed by using the manufacturing method of the display substrate, the active layer 120 includes a first conductive part 121 and a second conductive part 122, the first conductive part 121 and the second conductive part 122 are located at two sides of the second opening 120A in the first direction, the connection part 156 is at least partially located within the second opening 120A and connects the first conductive part 121 and the second conductive part 122. It should be noted that the abovementioned first direction may be a direction parallel to the base substrate. In this way, the connection part can make up for the missing part of the active layer in the second opening, and electrically connect the first conductive part and the second conductive part.

In some examples, in the abovementioned manufacturing method of the display substrate, sequentially forming the active material layer and the first gate insulating pattern on the base substrate includes: sequentially forming an active material layer and a gate insulating layer on the base substrate; and patterning the gate insulating layer by using a first mask to form a first gate insulating pattern.

In some examples, in the abovementioned manufacturing method of the display substrate, forming the second photoresist pattern at the side of the metal conductive layer away from the base substrate includes: forming a second photoresist pattern at the side of the metal conductive layer away from the base substrate by using a first mask plate. It can be seen that the second photoresist pattern and the third photoresist pattern can be manufactured using the same mask plate, that is, the conductive structure and the first gate insulating pattern can be manufactured using the same mask plate, so that costs can be reduced.

In some examples, as illustrated by FIG. 19, forming the second photoresist pattern at the side of the metal conductive layer away from the base substrate by using the first mask includes: controlling an exposure amount so that a dimension of the second photoresist pattern is smaller than a dimension of the third photoresist pattern. Thus, although the formation of the second photoresist pattern adopts the first mask plate, the dimension of the second photoresist pattern can be made smaller than the dimension of the third photoresist pattern by controlling the exposure amount (for example, increasing the exposure amount), so that the dimension of the finally formed conductive structure is larger than the dimension of the insulating layer opening (for example, a third overlapping part and a fourth overlapping part can be formed).

In some examples, in the abovementioned manufacturing method of the display substrate, the overlapping part of the orthographic projection of the insulating layer opening on the base substrate and the orthographic projection of the opening of the mask on the base substrate approximately coincides with the orthographic projection of the second opening on the base substrate.

In some examples, as illustrated by FIG. 19, in a display substrate formed by using the manufacturing method of a display substrate, the orthographic projection of the conductive structure 150 on the base substrate 110 covers the orthographic projection of the second opening 120A on the base substrate 110, and the second opening 120A is completely filled with the connection part 156. That is, the connection part 156 not only connects the first conductive part 121 and the second conductive part 122 located at two sides of the second opening 120A, but also completely fills the second opening 120A.

In some examples, as illustrated by FIG. 19, in a display substrate formed by using the manufacturing method of a display substrate, the conductive structure 150 further includes a first overlapping part 151 and a second overlapping part 152; the first overlapping part 151 is located at a side of the extension part 144 away from the base substrate 110, and is arranged in direct contact with the extension part 144; the second overlapping part 152 is located at the side of the first conductive part 121 away from the base substrate 110, and is arranged in direct contact with the first conductive part 121; the first overlapping part 151, the second overlapping part 152 and the connection part 156 are sequentially arranged along the first direction and are arranged continuously. In this way, the conductive structure is electrically connected with the extension part and the first conductive part respectively through the first overlapping part and the second overlapping part, so that current transmission capability of the conductive channel formed by the metal conductive layer, the conductive structure and the active layer is further increased.

In some examples, as illustrated by FIG. 19, in a display substrate formed by using the manufacturing method of a display substrate, the conductive structure 150 can be etched using the mask plate of the gate insulating pattern 130, so that no additional masking process is required, to reduce the cost. In this case, the conductive structure 150 may just include the first overlapping part 151, the second overlapping part 152 and the connection part 156 described above, so that while reducing the cost, the current transmission capability of the conductive channel formed by the metal conductive layer, the conductive structure and the active layer can also be improved.

In some examples, as illustrated by FIG. 19, in a display substrate formed by using the manufacturing method of a display substrate, the conductive structure 150 further includes a third overlapping part 153 located at a side of the second conductive part 122 away from the base substrate 110, and is arranged in direct contact with the second conductive part 122. Because the conductive structure can be formed by a stripping process, the formed conductive structure can include the abovementioned third overlapping part. The third overlapping part can further improve the current transmission capability of the conductive channel formed by the metal conductive layer, the conductive structure and the active layer. It should be noted that, in the case of using the first mask to pattern the conductive structure, the exposure amount may be controlled such that the dimension of the second photoresist pattern is smaller than the dimension of the third photoresist pattern. In this way, although the first mask plate is used to form the second photoresist pattern, the dimension of the second photoresist pattern can be made smaller than the dimension of the third photoresist pattern by controlling the exposure amount (for example, increasing the exposure amount). Thus, the finally formed conductive structure includes the abovementioned third overlapping part.

In some examples, as illustrated by FIG. 19, in a display substrate formed by using the manufacturing method of a display substrate, the conductive structure 150 further includes a fourth overlapping part 154 located at a side of the main body part 142 of the metal conductive layer 140 away from the base substrate 110, and the orthographic projection of the fourth overlapping part 154 on the base substrate 110 is located outside the orthographic projection of the first opening 130A on the base substrate 110. Because the conductive structure can be formed by a stripping process, the formed conductive structure includes the abovementioned fourth overlapping part. The fourth overlapping part can further improve the current transmission capability of the conductive channel formed by the metal conductive layer, the conductive structure and the active layer. It should be noted that, in the case of using the first mask to pattern the conductive structure, the exposure amount can be controlled so that the dimension of the second photoresist pattern is smaller than the dimension of the third photoresist pattern. In this way, although the first mask plate is used to form the second photoresist pattern, the dimension of the second photoresist pattern can be made smaller than the dimension of the third photoresist pattern by controlling the exposure amount (for example, increasing the exposure amount), so that the finally formed conductive structure includes the abovementioned third overlapping part and fourth overlapping part.

In some examples, as illustrated by FIG. 19, in a display substrate formed by using the manufacturing method of a display substrate, the sum of the first dimension D1 of the third overlapping part 153 in the first direction and the second dimension D2 of the fourth overlapping part 154 in the first direction ranges from 0.5 μm to 1.5 μm. In this way, the third overlapping part and the fourth overlapping part can effectively improve the current transmission capability of the conductive channel formed by the metal conductive layer, the conductive structure and the active layer.

It is worth noting that in the embodiment of the present disclosure, because the conductive structure can be made of transparent conductive oxide material, the conductive structure can also be made with the same mask plate as the anode. For example, after forming the metal conductive layer, an insulating layer such as a passivation layer and a flat layer including an opening exposing the second opening may be formed, then the abovementioned conductive structure and the anode are formed through a masking process.

Figure 20:
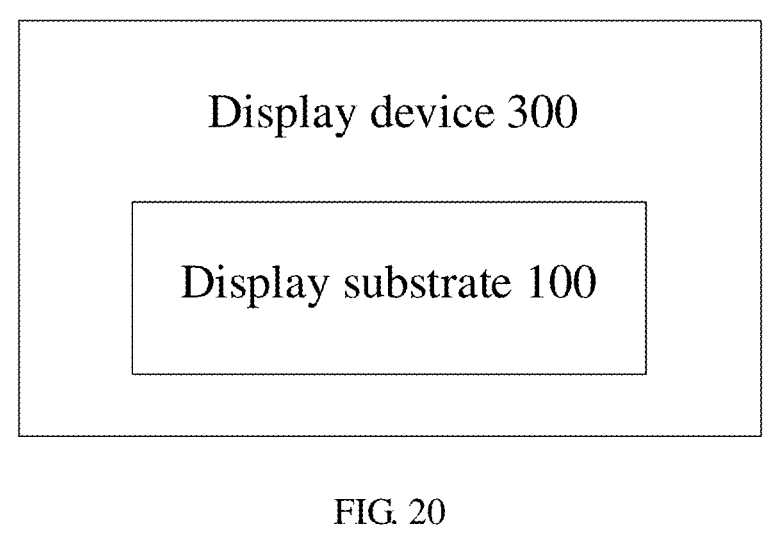

An embodiment of the present disclosure further provides a display device. FIG. 20 is a schematic diagram of a display device provided by an embodiment of the present disclosure. As illustrated by FIG. 20, the display device 300 includes the abovementioned display substrate 100. In this way, the display device can avoid the formation of a stable conductive channel with strong current transmission capability between the metal conductive layer and the active layer, so that various defects are avoided.

For example, in some examples, the display device may be any product or component with a display function, such as a smart phone, a tablet computer, a television, a monitor, a notebook computer, a digital photo frame and a navigator.

The following points required to be explained:

(1) the drawings of the embodiments of the present disclosure only relate to the structures related to the embodiments of the present disclosure, and other structures can refer to the general design.

(2) without conflict, the embodiments of the present disclosure and the features in the embodiments may be combined with each other.

The above is only the specific embodiment of this disclosure, but the protection scope of the present disclosure is not limited thereto. Any person familiar with the technical field can easily think of changes or substitutions within the technical scope disclosed in the present disclosure, and they should be included in the protection scope of the present disclosure. Therefore, the scope of protection of the present disclosure should be based on the scope of protection of the claims.

The invention claimed is:

1. A display substrate, comprising:

a base substrate;

an active layer, located on the base substrate;

a gate insulating pattern, located at a side of the active layer away from the base substrate;

a metal conductive layer, at least partially located at a side of the gate insulating pattern away from the base substrate; and a conductive structure, wherein the gate insulating pattern comprises a first opening of the gate insulating pattern, the active layer comprises a second opening of the active layer, an orthographic projection of the second opening of the active layer on the base substrate is located within an orthographic projection of the first opening of the gate insulating pattern on the base substrate, the metal conductive layer comprises a main body part and an extension part of the metal conductive layer extending into the first opening of the gate insulating pattern, the extension part of the metal conductive layer is electrically connected with the active layer exposed by the first opening of the gate insulating pattern, and the conductive structure is overlapped with the extension part of the metal conductive layer, and comprises a connection part extending to the second opening of the active layer and electrically connecting the active layer on two sides of the second opening of the active layer.

2. The display substrate according to claim 1, wherein the active layer comprises a first conductive part and a second conductive part, the first conductive part and the second conductive part are located at two sides of the second opening of the active layer in a first direction, wherein the first direction is an arrangement direction of the first conductive part and the second conductive part, and the connection part is located at least partially within the second opening of the active layer and connects the first conductive part and the second conductive part.

3. The display substrate according to claim 2, wherein an orthographic projection of the conductive structure on the base substrate covers an orthographic projection of the second opening of the active layer on the base substrate, and the second opening of the active layer is completely filled by the connection part.

4. The display substrate according to claim 2, wherein the conductive structure further comprises:

a first overlapping part, located at a side of the extension part of the metal conductive layer away from the base substrate, and arranged in direct contact with the extension part of the metal conductive layer; and a second overlapping part, located at a side of the first conductive part away from the base substrate, and arranged in direct contact with the first conductive part, wherein the first overlapping part, the second overlapping part, and the connection part are sequentially arranged along the first direction, and are continuously arranged along the first direction.

5. The display substrate according to claim 4, wherein the conductive structure further comprises:

a third overlapping part, located at a side of the second conductive part away from the base substrate, and arranged in direct contact with the second conductive part.

6. The display substrate according to claim 5, wherein the conductive structure further comprises:

a fourth overlapping part, located at a side of the main body part of the metal conductive layer away from the base substrate, an orthographic projection of the fourth overlapping part on the base substrate is outside the orthographic projection of the first opening of the gate insulating pattern on the base substrate.

7. The display substrate according to claim 6, wherein a value range of a sum of a first dimension in the first direction of the third overlapping part and a second dimension in the first direction of the fourth overlapping part is from 0.5 microns to 1.5 microns.

8. The display substrate according to claim 6, wherein a first dimension in the first direction of the third overlapping part or a second dimension in the first direction of the fourth overlapping part is smaller than a dimension of the second opening of the active layer in the first direction.

9. The display substrate according to claim 6, wherein a first dimension in the first direction of the third overlapping part or a second dimension in the first direction of the fourth overlapping part is smaller than a dimension in the first direction of the first conductive part.

10. The display substrate according to claim 6, wherein a dimension in the first direction of the first conductive part is smaller than a dimension in the first direction of the second opening of the active layer.

11. The display substrate according to claim 6, wherein a dimension in the first direction of the conductive structure is smaller than a dimension in the first direction of the second conductive part.

12. The display substrate according to claim 6, wherein the metal conductive layer comprises a drain electrode and a gate electrode, the drain electrode and the gate electrode are located at two sides of the second opening of the active layer in the first direction, the drain electrode is arranged in partial contact with the first conductive part, the active layer further comprises a channel, located at a side of the second conductive part away from the second opening of the active layer, and an orthographic projection of the gate electrode on the base substrate is overlapped with an orthographic projection of the channel on the base substrate.

13. The display substrate according to claim 12, wherein a dimension in the first direction of the conductive structure is smaller than a dimension in the first direction of the channel.

14. A display device, comprising the display substrate according to claim 1.

15. A manufacturing method of a display substrate, comprising:

sequentially forming an active material layer and a gate insulating layer on a base substrate, patterning the gate insulating layer to form a first gate insulating pattern comprising an insulating layer opening;

performing a first conductor-converting process on the active material layer by using the insulating layer opening;

forming a metal material layer at a side of the first gate insulating pattern away from the base substrate;

forming a first photoresist pattern comprising a mask opening, and patterning the metal material layer by using the first photoresist pattern to form a metal conductive layer;

patterning the first gate insulating pattern by using the first photoresist pattern, further removing a part of the first gate insulating pattern, to form a second gate insulating pattern, wherein the second gate insulating pattern comprises a first opening of the second gate insulating pattern;

performing a second conductor-converting process on the active material layer by using the first photoresist pattern, wherein the active material layer is partially removed during the patterning process of the second gate insulating pattern and the second conductor-converting process to form an active layer, and the active layer comprises a second opening of the active layer; and forming a conductive structure at a side of the metal conductive layer away from the base substrate, wherein an orthographic projection of the second opening of the active layer on the base substrate is located within an orthographic projection of the first opening of the second gate insulating pattern on the base substrate, the metal conductive layer comprises a main body part and an extension part of the metal conductive layer extending into the first opening of the second gate insulating pattern, the extension part of the metal conductive layer is electrically connected with the active layer exposed by the first opening of the second gate insulating pattern, the conductive structure is overlapped with the extension part of the metal conductive layer, and comprises a connection part extending to the second opening of the active layer and electrically connecting the active layer on two sides of the second opening of the active layer.

16. The manufacturing method of the display substrate according to claim 15, wherein the forming the conductive structure at the side of the metal conductive layer away from the base substrate comprises:

removing the first photoresist pattern, and forming a second photoresist pattern at the side of the metal conductive layer away from the base substrate;

forming a conductive layer at a side of the second photoresist pattern away from the base substrate; and stripping the second photoresist pattern, and stripping the conductive layer located on the second photoresist pattern, wherein the remaining conductive layer forms the conductive structure.

17. The manufacturing method of the display substrate according to claim 16, wherein the patterning the gate insulating layer to form the first gate insulating pattern comprising the insulating layer opening comprises:

forming a third photoresist pattern at a side of the gate insulating layer away from the base substrate by using a first mask plate; and patterning the gate insulating layer by using the third photoresist pattern to form the first gate insulating pattern.

18. The manufacturing method of the display substrate according to claim 17, wherein the forming the second photoresist pattern at the side of the metal conductive layer away from the base substrate comprises:

using the first mask plate to form the second photoresist pattern at the side of the metal conductive layer away from the base substrate.

19. The manufacturing method of the display substrate according to claim 15, wherein an overlapping part of an orthographic projection of the insulating layer opening on the base substrate and an orthographic projection of the mask opening on the base substrate substantially coincides with the orthographic projection of the second opening of the active layer on the base substrate.

20. The manufacturing method of the display substrate according to claim 15, wherein the active layer comprises a first conductive part and a second conductive part, the first conductive part and the second conductive part are located at two sides of the second opening of the active layer in a first direction, wherein the first direction is an arrangement direction of the first conductive part and the second conductive part, and the connection part is located at least partially within the second opening of the active layer and connects the first conductive part and the second conductive part.

* * * * *